United States Patent
Halvorson

(10) Patent No.: US 7,639,998 B1
(45) Date of Patent: Dec. 29, 2009

(54) RF RECEIVER UTILIZING DYNAMIC POWER MANAGEMENT

(75) Inventor: David H. Halvorson, Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 574 days.

(21) Appl. No.: 11/703,351

(22) Filed: Feb. 7, 2007

(51) Int. Cl.
   *H04B 1/16* (2006.01)

(52) U.S. Cl. ............... 455/251.1; 455/234.2; 455/343.1

(58) Field of Classification Search ............ 455/232.1, 455/234.1, 234.2, 241.1, 250.1, 251.1, 253.2, 455/343.1
See application file for complete search history.

(56) References Cited

U.S. PATENT DOCUMENTS

| | | | |
|---|---|---|---|
| 5,758,271 A * | 5/1998 | Rich et al. | 455/234.1 |
| 6,389,272 B1 * | 5/2002 | Horigome et al. | 455/234.1 |
| 6,498,926 B1 * | 12/2002 | Ciccarelli et al. | 455/240.1 |
| 6,498,927 B2 * | 12/2002 | Kang et al. | 455/245.2 |
| 6,625,433 B1 * | 9/2003 | Poirier et al. | 455/232.1 |
| 6,668,164 B2 | 12/2003 | Hughes | |
| 6,735,424 B1 | 5/2004 | Larson | |
| 6,965,655 B1 | 11/2005 | Mostov | |
| 6,993,291 B2 * | 1/2006 | Parssinen et al. | 455/67.11 |
| 7,116,949 B2 | 10/2006 | Irle | |
| 7,212,798 B1 * | 5/2007 | Adams et al. | 455/251.1 |
| 2003/0027538 A1 * | 2/2003 | Masumoto et al. | 455/234.1 |
| 2003/0162518 A1 * | 8/2003 | Baldwin et al. | 455/253.2 |
| 2005/0026564 A1 | 2/2005 | Haub | |
| 2006/0030286 A1 | 2/2006 | Haub | |
| 2006/0040617 A1 | 2/2006 | Haub | |
| 2006/0040630 A1 | 2/2006 | Mostov | |
| 2006/0111066 A1 * | 5/2006 | Thorpe | 455/232.1 |
| 2006/0148437 A1 | 7/2006 | Krivokapic | |
| 2007/0004361 A1 * | 1/2007 | Srinivasan et al. | 455/252.1 |
| 2008/0003966 A1 * | 1/2008 | Magnusen | 455/232.1 |
| 2008/0160947 A1 * | 7/2008 | Xin et al. | 455/247.1 |

* cited by examiner

*Primary Examiner*—Blane J Jackson
(74) *Attorney, Agent, or Firm*—Matthew J. Evans; Daniel M. Barbieri

(57) ABSTRACT

A radio frequency (RF) receiver utilizing dynamic power management for administration of power consumption. The RF receiver includes an RF antenna, an RF full band filter, an RF amplifier, an RF sub-band filter, a first local oscillator, an RF mixer, a first IF amplifier, an IF wide band filter, a second local oscillator, an IF mixer, two secondary IF amplifiers, an IF narrow band filter, a digital signal processing subsystem, three power sensors, and a control logic subsystem. Based on its location in the system, each power sensor has a unique threshold setting that is set just below a total RF power level where desired signal degradation might occur. The control logic subsystem utilizes outputs of the power sensors to detect a total RF power present due to interfering signals plus a desired signal within an entire bandwidth present at each stage and dynamically manages power by adjusting bias of each stage accordingly via its bias control outputs.

29 Claims, 2 Drawing Sheets

RF RECEIVER UTILIZING DYNAMIC POWER MANAGEMENT

BACKGROUND OF THE INVENTION

1. Field of the Invention

The present invention relates generally to techniques for reducing power consumption of radio frequency receivers and more specifically to methods and apparatus for dynamically managing power consumption of radio frequency receivers operating in interference environments via environment sensing.

2. Description of the Related Art

Current art for radio frequency (RF) receivers operating in a high interference or co-site environment generally take one of two approaches, both of which are expensive and dissipate high power:

a) Operate a receiver front end and intermediate frequency (IF) components at very high IP3 levels, i.e. utilize high powered components so that distortion does not occur; and, b) Add additional hardware outside the receiver volume such as high performance filters, or active canceling circuitry. Filtering has a restricted area of benefit and active canceling is extremely expensive and has specific demands on the host vehicle's antenna architecture.

The approach of operating a receiver front end and IF components at very high IP3 levels is often the only practical approach for operation in high interference and/or co-site environments. However, most receivers, especially those fielded on mobile platforms such as ground vehicles or aircraft will spend a significant amount of time in benign interference environments. While operating in benign environments, the high power applied to achieve high IP3 performance is wasted. This wasted power increases the operating temperature of receiving system with a corresponding reduction in its reliability.

RF and IF amplifier devices and mixers can and are being developed with programmable bias points that provide IP3 and corresponding compression point performance proportional to DC power consumption. Power reductions of 30% or more have been demonstrated with only minor variations in other important parameters such as gain, Noise Figure, stability, and voltage standing wave ratio (VSWR).

U.S. Pat. No. 7,116,949, issued to Kiyoshi Irie, etc., entitled, "Semiconductor Integrated Circuit Device and Wireless Communication System," discloses a technology which may be effectively applied, while increase of power consumption is controlled, for improving linearity of a semiconductor integrated circuit device comprising an amplifying circuit to amplify the code division multiplexed transmitting signal. The technology may be effectively applied to a semiconductor integrated circuit device for communication constituting a wireless communication device, for example, of W-CDMA (Wideband Code Division Multiple Access) system and to a wireless communication device such as a mobile telephone or the like comprising the same semiconductor integrated circuit device.

U.S. Pat. No. 6,735,424, issued to Larson, et al., entitled, "S-band Low-noise Amplifier with Self-adjusting Bias for Improved Power Consumption and Dynamic Range in a Mobile Environment" discloses a discrete low-noise amplifier designed to operate in a mobile wireless environment. It uses two cascaded GaAs FETs to achieve 25 dB gain and 0.9 dB noise figure at 2.5 GHz. Active bias control circuitry responsive to a monitored amplifier output power automatically and continuously adjusts the drain-source currents, and the load lines, of the cascaded FETs to (i) maintain power consumption at 33 milliwatts in nominal small-signal conditions, and to (ii) provide an elevated input third-order intermodulation intercept point (IP3) and a reduced noise figure during the presence of jamming. A 15 dB improvement in the input IP3 is achieved in large-signal operation. Amplifier operation is supported by an a.c. power detector of enhanced sensitivity and responsiveness because of un-grounded operation.

U.S. Pub. No. 2006/0148437, to Krivokapic, entitled, "Circuit and Method for Reducing Mobile Station Receiver Power Consumption by Dynamically Controlling Linearity and Phase Noise Parameters" discloses a method of reducing mobile station power consumption. A comparison is made in a number of scenarios of a current channel gain setting for a receiver to a threshold. If the current channel gain setting is less than the threshold, then current within at least a portion of the receiver is decreased. In one scenario, the comparison is only made in event that no single tone interferer is detected. In another scenario, the comparison is made to a tolerable single tone blocker threshold, and if greater then current is decreased. In another scenario, the comparison is made to an acceptable intermodulation response rejection threshold, and if greater then current is decreased. In yet another scenario, the comparison is made to an acceptable spurious free dynamic range threshold, and if greater then current is decreased. The portions of the receiver for which current decreases are implemented include a low noise amplifier, mixer, voltage controlled oscillator and variable gain amplifiers.

U.S. Pub. No. 2006/0040630, to Mostov, et al., entitled, "Apparatus for and Method of Optimizing the Performance of a Radio Frequency Receiver in the Presence of Interference" discloses an apparatus for and method of extending the dynamic range of a RF communications receiver. The invention provides a mechanism for controlling the gain of both the LNA and down conversion mixer in the front end portion of an RF receiver. Both the LNA and the mixer are adapted to have both low and high gain modes of operation. The control mechanism typically comprises a two bit gain control that places both the LNA and mixer in one of four operating gain mode states. The selection of the most appropriate operating gain mode state is preferably determined in accordance with various metrics such as the received levels of the desired signal, levels of interference signals, bit error rate and receiver RSSI.

Referring now to FIG. 1 (Prior Art), the architecture of a typical wideband, dual-conversion RF receiver is illustrated. The receiver may include an antenna (ANT), an RF full band filter (F1), an RF amplifier (A1), an RF sub-band filter (F2), a first local oscillator (LO1), an RF mixer (M1), a first IF amplifier (A2), a first IF wide band filter (F3), a second local oscillator (LO2), an IF mixer (M2), a secondary IF amplifier (A3), a second IF narrow band filter (F4), another secondary IF amplifier (A4) and a digital signal processing (DSP) subsystem. Each filter starting from the antenna input gets successively narrower. The final channel selectivity is implemented in the DSP. The RF amplifier (A1) has the widest frequency bandwidth at its input (1 GHz in this example) with each stage of amplification or mixing susceptible to a narrower frequency bandwidth. However due to the cascading of gain through the active stages, the later stages can have a larger signal level at their inputs. In the presence of large, undesired signal, high dynamic range (i.e. high IP3) RF devices are required to minimize receiver performance degradation due to Intermodulation Products, Cross-Modulation, and Desensitization. In the system illustrated in FIG. 1, there is no way to estimate the level of interference that may be occurring within the receiver since only the DSP has any knowledge of the desired signal integrity. The DSP has no way of determining that the desired signal was degraded elsewhere in the receiver. In order to minimize desired signal degradation, all devices continuously operate at full bias. As a result, while operating in benign environments, the high power applied to achieve high IP3 performance is wasted. This wasted power increases the operating temperature of the receiver with a corresponding reduction in its reliability.

SUMMARY OF THE INVENTION

In a broad aspect, the present invention is a radio frequency (RF) receiver utilizing dynamic power management for administration of power consumption. An antenna (ANT) receives RF signals in a high interference and/or co-site environment. An RF full band filter (F1) filters the received RF signals from an output of the ANT to filtered full band RF signals. An RF amplifier (A1) amplifies the filtered full band RF signals to enlarged full band RF signals suitable for RF sub-band filtering. An RF sub-band filter (F2) filters the enlarged full band RF signals to sub-band RF signals. A first local oscillator (LO1) provides a first local oscillator frequency. An RF mixer (M1) operatively associated with the LO1 translates a frequency of the sub-band RF signals from an output of the F2 to intermediate frequency (IF) signals utilizing the first local oscillator frequency. A first IF amplifier (A2) amplifies the IF signals from an output of the M1 to enlarged IF signals suitable for IF wide band filtering. A first IF wide band filter (F3) filters the enlarged IF signals from an output of the A2 to filtered wide band IF signals. A second oscillator (LO2) provides a second local oscillator frequency. The IF mixer (M2) operatively associated with the LO2 translates a frequency of the wide band IF signals from an output of the F3 to IF signals with a frequency lower than that of the output of the M1 utilizing the second local oscillator frequency. A secondary IF amplifier (A3) amplifies the IF signals from an output of the M2 to enlarged IF signals suitable for IF narrow band filtering. A second IF narrow band filter (F4) filters the enlarged wide band IF signals of an output of the A3 to narrow band IF signals. A secondary IF amplifier (A4) amplifies the narrow band IF signals of an output of the F4 to enlarged narrow band IF signals suitable for analog-to-digital conversion and digital signal processing. A digital signal processing (DSP) subsystem includes at least one analog-to-digital converter and at least one digital signal processor. The analog-to-digital converter converts the enlarged narrow band IF signals to digital signals for the digital signal processor to process.

In a highly preferred embodiment, a first power sensor is associated with an input of the A1 for coupling the full band RF signals; a second power sensor is associated with an input of the M1 for coupling the sub-band RF signals; and, a third power sensor is associated with an input of the M2 for coupling the wide band IF signals. Each of the power sensors has a threshold setting unique to its location in the system, the unique threshold setting for each power sensor is set to a level just below a total RF power level where desired signal degradation may occur. An output of the digital processing (DSP) subsystem sent to the control logic subsystem is utilized to determine if a significant portion of a total power sensed at each power sensor is a desired signal. The output of the digital processing subsystem sent to the control logic subsystem is also utilized to serve as a power sensor for narrow band IF signals after the second IF filter (F4). A control logic subsystem operatively associated with the power sensors and the digital signal processing subsystem detects an interference environment based on their outputs and determines its bias outputs accordingly. The bias outputs of the control logic subsystem are fed to the RF amplifier (A1), the first IF amplifier (A2), the secondary IF amplifiers (A3 and A4), and the local oscillators (LO1 and LO2) to control their power consumptions to reduce overall power consumption and thermal load of the RF receiver. Thus, the IP3 performance of the RF receiver is dynamically adjusted based on an interfering environment that it is operating within.

The full power of the dynamic power management aspect of the RF receiver of the present invention is only utilized when an interfering signal is actually present on the receiver input and has a potential for degrading a reception of a desired signal. The present invention further takes advantage of the filtering already in the receiver to provide power control on a stage by stage basis. The present invention, while it does not reduce the maximum power needed to operate a RF receiver, can significantly decrease the average power needed. When the present invention is considered in a multi-channel receiving system such as the Joint Tactical Radio System (JTRS) with individual receive channels spread over a wide range of frequencies, the average power saving can become substantial. Maximum power on all channels simultaneously will occur only rarely. This significant reduction in average power consumption translates to a lower overall system thermal load and increased reliability.

DETAILED DESCRIPTION OF THE INVENTION

Figure 1:
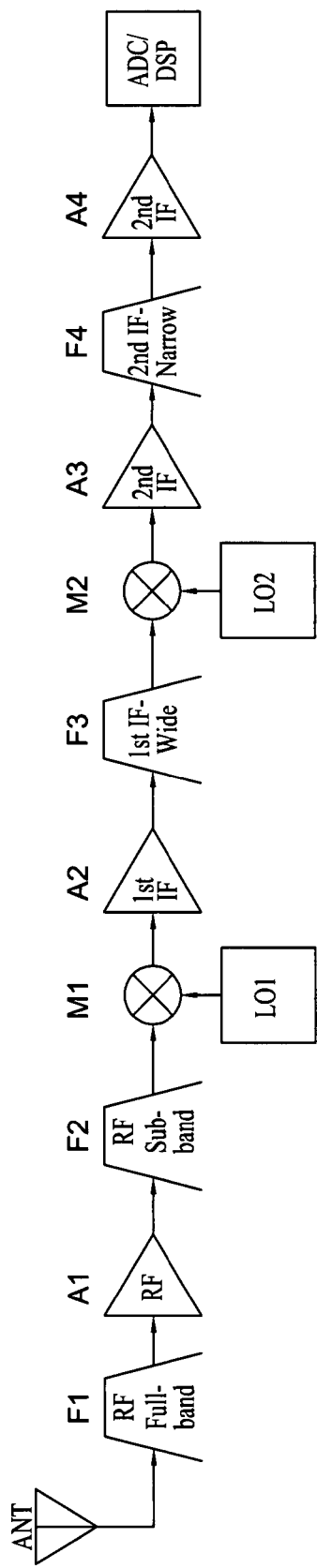
FIG. 1 (Prior Art) is a block diagram of a wide band dual-conversion RF receiver.
Figure 2:
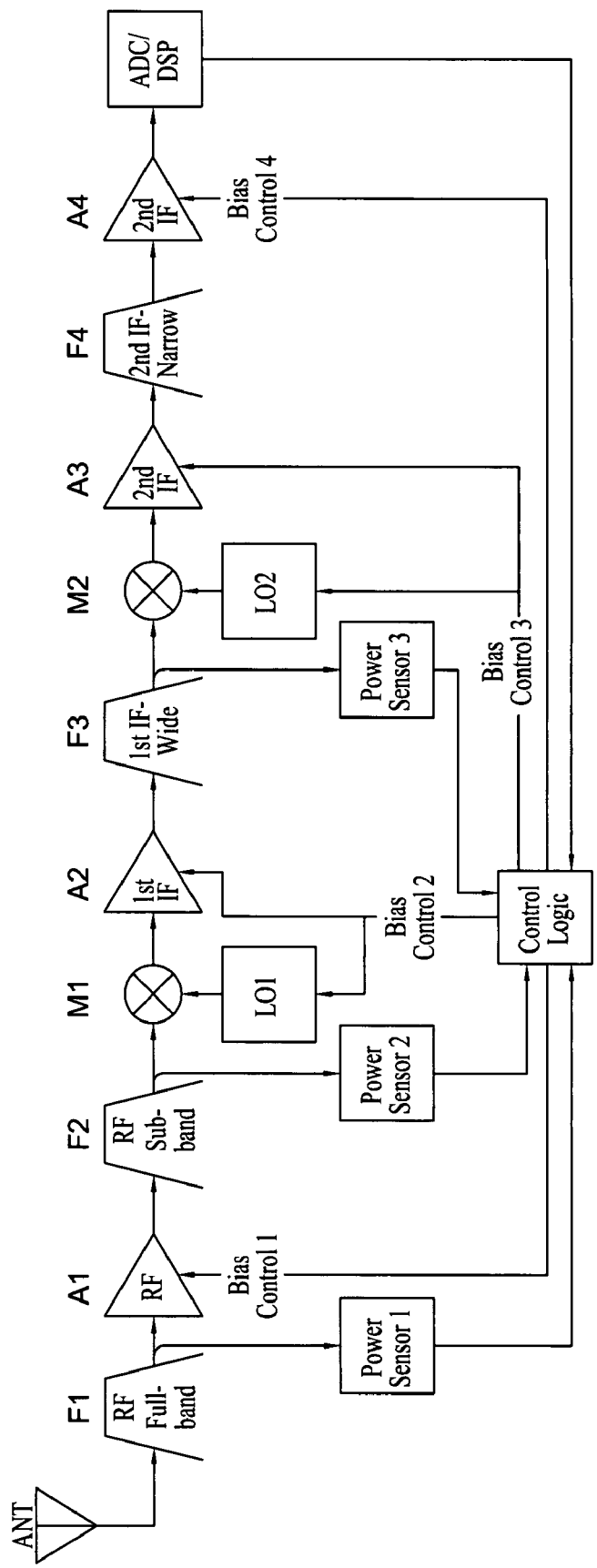
FIG. 2 illustrates a radio frequency (RF) receiver utilizing dynamic power management for administration of power consumption in accordance with the principles of the present invention.

Referring now to FIG. 2, a preferred embodiment of a radio frequency (RF) receiver utilizing dynamic power management for administration of power consumption in accordance with the principles of the present invention is illustrated. The RF receiver includes an antenna (ANT) that receives RF signals in a high interference and/or co-site environment. An RF full band filter (F1) filters the received RF signals from an output of the ANT to filtered full band RF signals. The F1 may have, for example, for the purposes of illustration but not limitation, a bandwidth of approximately 1 GHz.

An RF amplifier (A1) amplifies the filtered full band RF signals to enlarged full band RF signals suitable for RF sub-band filtering. The A1 has programmable bias points (BiasControl1) with a gain of, for example, approximately 10 dB.

An RF sub-band filter (F2) filters the enlarged full band RF signals to sub-band RF signals. The F2 may have a bandwidth of, for example, approximately 100 MHz.

A first local oscillator (LO1) provides a first local oscillator frequency. An RF mixer (M1) operatively associated with the LO1 translates a frequency of the sub-band RF signals from an output of the F2 to intermediate frequency (IF) signals utilizing the first local oscillator frequency. A first IF amplifier (A2) amplifies the IF signals from an output of the M1 to enlarged IF signals suitable for IF wide band filtering. The M1, the LO1 and the A2 have programmable bias points (BiasControl2). The M1 may have, for example, a 0 dB gain and the A2 may have a programmable gain of, for example, 10 dB.

A first IF wide band filter (F3) filters the enlarged IF signals from an output of the A2 to filtered wide band IF signals. The F3 may have a bandwidth of, for example, 10 MHz.

A second oscillator (LO2) provides a second local oscillator frequency. The IF mixer (M2) operatively associated with the LO2 translates a frequency of the wide band IF signals from an output of the F3 to IF signals with a frequency lower than that of the output of the M1 utilizing the second local oscillator frequency. A secondary IF amplifier (A3) amplifies the IF signals from an output of the M2 to enlarged IF signals suitable for IF narrow band filtering. The M2, the LO2 and the A3 have programmable bias points (BiasControl3). The M2 may have, for example, a 0 dB gain and the A3 has a programmable gain of, for example, approximately 10 dB.

A second IF narrow band filter (F4) filters the enlarged wide band IF signals of an output of the A3 to narrow band IF signals. The F4 may have a bandwidth of, for example, approximately 1 MHz. A secondary IF amplifier (A4) amplifies the narrow band IF signals of an output of the F4 to enlarged narrow band IF signals suitable for analog-to-digital conversion and digital signal processing. The A4 has programmable bias points (BiasControl4) with a gain of, for example, approximately 10 dB.

A digital signal processing (DSP) subsystem includes at least one analog-to-digital converter and at least one digital signal processor. The analog-to-digital converter converts the enlarged narrow band IF signals to digital signals for the digital signal processor to process.

A first power sensor (PowerSensor1), in a highly preferred embodiment, is associated with an input of the RF full band amplifier (A1). Alternately, the first power sensor (PowerSensor1) can be associated with an output of the RF full band amplifier (A1). The first power sensor (PowerSensor1) couples the full band RF signals associated with the A1 and detects a total RF power present due to one or many interfering signals plus a desired signal within a bandwidth of the RF full band filter (F1) present at the RF amplifier (A1).

A second power sensor (PowerSensor2), in a highly preferred embodiment, is associated with an input of the RF mixer (M1). Alternately, the second power (PowerSensor1) can be associated with an output of the RF mixer (M1), an output of the LO1 or even an output of the A2. The second power sensor (PowerSensor2) couples sub-band RF signals associated with the M1 and detects a total RF power present due to one or many interfering signals plus a desired signal within a bandwidth of the RF sub-band filter (F2) present at the RF mixer (M1).

A third power sensor (PowerSensor3), in a highly preferred embodiment, is associated with an input of the IF mixer (M2). Alternately, the third power (PowerSensor3) can be associated with an output of the RF mixer (M2), an output of the LO2 or even an output of the A3. The third power sensor (PowerSensor3) couples wide band IF signals associated with the M2 and detects a total IF power present due to one or many interfering signals plus a desired signal within a bandwidth of the IF wide band filter (F3) present at the IF mixer (M2).

A fourth power sensor (PowerSensor4, not shown) could also be added at the input to the A4. This power sensor would be used in applications where the bandwidth of the F4 is significantly wider than the digital filtering provided in the DSP. This sensor is not needed when the F4 is about the same bandwidth as the DSP filter because the DSP can perform this power sensing.

Each of the power sensors has a threshold setting unique to its location in the system, the unique threshold setting for each power sensor is set to a level just below a total RF power level where desired signal degradation may occur.

An output of the digital processing (DSP) subsystem sent to the control logic subsystem is utilized to determine if a significant portion of a total power sensed at each power sensor is a desired signal. The output of the digital processing subsystem sent to the control logic subsystem is also utilized to serve as a power sensor for narrow band IF signals after the second IF filter (F4).

A control logic subsystem operatively associated with the power sensors (PowerSensor1, PowerSensor2 and PowerSensor3 and PowerSensor4, if used) and the digital signal processing subsystem detects an interference environment based on their outputs and determines its bias outputs accordingly. The bias outputs of the control logic subsystem are fed to the RF amplifier (A1), the first IF amplifier (A2), the secondary IF amplifiers (A3 and A4), and the local oscillators (LO1 and LO2) to control their power consumptions to reduce overall power consumption and thermal load of the RF receiver.

The programmable bias points of the RF amplifier (A1), the local oscillators (LO1 and LO2), the RF mixer (M1), the first IF amplifier (A2), the IF mixer (M2), and the secondary IF amplifiers (A3 and A4), set by the bias outputs of the control logic subsystem, provide IP3 performance proportional to DC power consumption.

Thus, the operation of the system 10 of the present invention can be summarized by the following steps:

a) receiving RF signals utilizing an antenna (ANT);
b) filtering the RF signals from an output of the ANT to filtered full band RF signals utilizing an RF full band filter (F1);
c) amplifying the filtered full band RF signals to enlarged full band RF signals suitable for RF sub-band filtering utilizing an RF amplifier (A1);
d) filtering the enlarged full band RF signals to sub-band RF signals utilizing an RF sub-band filter (F2);
e) providing a first local oscillator frequency through a first local oscillator (LO1);
f) translating a frequency of the sub-band RF signals from an output of the F2 to intermediate frequency (IF) signals utilizing an RF mixer (M1) operatively associated with the first local oscillator (LO1) and the first local oscillator frequency;
g) amplifying the IF signals from an output of the M1 to enlarged IF signals suitable for IF wide band filtering utilizing a first IF amplifier (A2);
h) filtering the enlarged IF signals from an output of the A2 to filtered wide band IF signals utilizing a first IF wide band filter (F3);
i) providing a second local oscillator frequency through a second local oscillator (LO2);
j) translating a frequency of the filtered wide band IF signals from an output of the F3 to IF signals with a frequency lower than that of the output of the M1 utilizing an IF mixer (M2) operatively associated the second local oscillator (LO2) and the second oscillator frequency;
k) amplifying the IF signals from an output of the M2 to enlarged IF signals suitable for IF narrow band filtering utilizing a secondary IF amplifier (A3);
l) filtering the enlarged IF signals of an output of the A3 to narrow band IF signals utilizing a second IF narrow band filter (F4);
m) amplifying the narrow band IF signals of an output of the F4 to enlarged narrow band IF signals suitable for analog-to-digital conversion and digital signal processing utilizing another secondary IF amplifier (A4);

n) converting the enlarged narrow band IF signals to digital signals and processing the digital signals utilizing a digital signal processing subsystem (DSP);

o) coupling the full band RF signals associated with the RF amplifier (A1) utilizing a first power sensor (PowerSensor1) associated with the RF amplifier (A1);

p) coupling the sub-band RF signals associated with the RF mixer (M1) utilizing a second power sensor (PowerSensor2) associated with the RF mixer (M1);

q) coupling the wide band IF signals associated with the IF mixer (M2) utilizing a third power sensor (PowerSensor3) associated with the IF mixer (M2); and, r) detecting an interference environment and determining bias outputs of a control logic subsystem operatively associated with outputs of the power sensors and the digital signal processing subsystem, the bias outputs of the control logic subsystem being fed to the RF amplifier (A1), the first IF amplifier (A2), the secondary IF amplifiers (A3 and A4), and the local oscillators (LO1 and LO2) to control their power consumptions to reduce overall power consumption and thermal load of the RF receiver.

The IP3 performance of the RF receiver is dynamically adjusted based on an interfering environment that it is operating within. The full power of the RF receiver is only used when an interfering signal is actually present on the receiver input and has a potential for degrading a reception of the desired signal. The filtering capacity provided by the filters and the DSP in the RF receiver is utilized to manage power consumption on a stage by stage basis. The present invention, while it does not reduce the maximum power needed to operate an RF receiver, can significantly decrease the average power needed. This significant reduction in average power consumption translates to a lower overall system thermal load and increased reliability.

During operation, under conditions that the RF receiver is a considerable distance from any interfering signal sources and none of the power sensor outputs exceeds their corresponding threshold settings, the bias controls of the A1, the M1, the A2, the LO1, the M2, the LO2, the A3 and the A4 are all set to low power such that the RF receiver operates with minimum power and generates minimum thermal load.

During operation, under conditions that the RF receiver has several large interfering signals present on its input, all of the interfering signals are approximately more than 100 MHz away from a tuned frequency of the receiver, the PowerSensor1 exceeds its threshold setting and none of the PowerSensor2 and the PowerSensor3 exceed their threshold settings, the bias output of the control logic subsystem fed to the RF amplifier (A1) is increased and all of the other bias outputs of the control logic subsystem are set to low power as the interfering signals are blocked by the RF sub-band filter (F2).

During operation, under conditions that the RF receiver has a large interfering signal present on its input, the interfering signal is approximately 3 MHz away from a tuned frequency of the receiver, the outputs of the PowerSensor1, the PowerSensor2 and the PowerSensor3 all exceed their threshold settings, thus the bias outputs of the control logic subsystem fed to the A1, the LO1, the M1, the A2, the LO2, the M2, and the A3 are increased and the bias output of the control logic subsystem fed to the A4 is set to low power such that the A1, the LO1, the M1, the A2, the LO2, the M2 and the A3 operate at high power and the A4 operates at low power as the interfering signal is blocked by the second IF filter F4.

During operation, under conditions that the RF receiver has a moderately interfering signal present on its input, the interfering signal is approximately 20 MHz away from a tuned frequency of the RF receiver, the interfering signal is at a power level not exceeding a threshold setting of the PowerSensor1 but exceeding a threshold setting of the PowerSensor2 due to cascaded gain of the RF receiver, the interfering signal is filtered by the F3 and the F4, and the interfering signal is at a power level not exceeding threshold settings of the PowerSensor3 and the DSP, thus only the bias output of the control logic subsystem fed to the LO1, the M1 and the A2 is set to high power and the bias outputs of the logic control subsystem fed to the A1, the LO2, the M2, the A3, and the A4 are set to low power.

Other embodiments and configurations may be devised without departing from the spirit of the invention and the scope of the appended claims.

The invention claimed is:

1. A radio frequency (RF) receiver utilizing dynamic power management for administration of power consumption, comprising:

a) an antenna (ANT) for receiving RF signals;

b) an RF full band filter (F1) for filtering said received RF signals from an output of said ANT to filtered full band RF signals;

c) an RF amplifier (A1) for amplifying said filtered full band RF signals to enlarged full band RF signals suitable for RF sub-band filtering;

d) an RF sub-band filter (F2) for filtering said enlarged full band RF signals to sub-band RF signals;

e) a first local oscillator (LO), denoted as LO1, for providing a first local oscillator frequency;

f) an RF mixer (M1) operatively associated with said first local oscillator (LO1) for translating a frequency of said sub-band RF signals from an output of said F2 to intermediate frequency (IF) signals utilizing said first local oscillator frequency;

g) a first IF amplifier (A2) for amplifying said IF signals from an output of said M1 to enlarged IF signals suitable for IF wide band filtering;

h) a first IF wide band filter (F3) for filtering said enlarged IF signals from an output of said A2 to filtered wide band IF signals;

i) a second local oscillator (LO), denoted as LO2, for providing a second local oscillator frequency;

j) an IF mixer (M2) operatively associated with said second local oscillator (LO2) for translating a frequency of said filtered wide band IF signals from an output of said F3 to IF signals with a frequency lower than that of said output of said M1 utilizing said second local oscillator frequency;

k) a secondary IF amplifier (A3) for amplifying said IF signals from an output of said M2 to enlarged IF signals suitable for IF narrow band filtering;

l) a second IF narrow band filter (F4) for filtering said enlarged IF signals of an output of said A3 to narrow band IF signals;

m) another secondary IF amplifier (A4) for amplifying said narrow band IF signals of an output of said F4 to enlarged narrow band IF signals suitable for analog-to-digital conversion and digital signal processing;

n) a digital signal processing (DSP) subsystem, comprising:

i. at least one analog-to-digital converter for converting said enlarged narrow band IF signals to digital signals; and, ii. at least one digital signal processor for processing said digital signals; and, o) a first power sensor (PowerSensor1) associated with said RF amplifier (A1) for coupling the full band RF signals associated with said RF amplifier (A1);

p) a second power sensor (PowerSensor2) associated with said RF mixer (M1) for coupling the sub-band RF signals associated with said RF mixer (M1);

q) a third power sensor (PowerSensor3) associated with said IF mixer (M2) for coupling the wide band IF signals associated with said IF mixer (M2); and, r) a control logic subsystem operatively associated with outputs of said power sensors and said digital signal processing subsystem for detecting an interference environment and determining its bias outputs accordingly, said bias outputs of said control logic subsystem being fed to said RF amplifier (A1), said first IF amplifier (A2), said secondary IF amplifiers (A3 and A4), and said local oscillators (LO1 and LO2) to control their power consumptions to reduce overall power consumption and thermal load of the RF receiver.

2. The radio frequency (RF) receiver of claim 1, wherein said RF amplifier (A1) has programmable bias points (BiasControl1).

3. The radio frequency (RF) receiver of claim 1, wherein said RF amplifier (A1) has a programmable gain.

4. The radio frequency (RF) receiver of claim 1, wherein said RF mixer (M1), said local oscillator (LO1), and said first amplifier (A2) have programmable bias points (BiasControl2).

5. The radio frequency (RF) receiver of claim 1, wherein said first IF amplifier (A2) has a programmable gain.

6. The radio frequency (RF) receiver of claim 1, wherein said IF mixer (M2), said local oscillator (LO2), and said secondary IF amplifier (A3) have programmable bias points (BiasControl3).

7. The radio frequency (RF) receiver of claim 1, wherein said secondary IF amplifier (A3) has a programmable gain.

8. The radio frequency (RF) receiver of claim 1, wherein said secondary IF amplifier (A4) has programmable bias points (BiasControl4).

9. The radio frequency (RF) receiver of claim 1, wherein said secondary IF amplifier (A4) has a programmable gain.

10. The radio frequency (RF) receiver of claim 1, wherein programmable bias points of said RF amplifier (A1), said local oscillators (LO1 and LO2), said RF mixer (M1), said first IF amplifier (A2), said IF mixer (M2), and said secondary IF amplifiers (A3 and A4), set by said bias outputs of said control logic subsystem, provide IP3 performance proportional to DC power consumption.

11. The radio frequency (RF) receiver of claim 1, wherein said first power sensor (PowerSensor1) is utilized to detect a total RF power present due to interfering signals plus a desired signal within a bandwidth of said RF full band filter (F1) present at said RF amplifier (A1).

12. The radio frequency (RF) receiver of claim 1, wherein said second power sensor (PowerSensor2) is utilized to detect a total RF power present due to interfering signals plus a desired signal within a bandwidth of said RF sub-band filter (F2) present at said RF mixer (M1).

13. The radio frequency (RF) receiver of claim 1, wherein said third power sensor (PowerSensor3) is utilized to detect a total IF power present due to interfering signals plus a desired signal within a bandwidth of said IF wide band filter (F3) present at said IF mixer (M2).

14. The radio frequency (RF) receiver of claim 1, wherein said output of said digital processing (DSP) subsystem is sent to said control logic subsystem to determine if a significant portion of total power sensed at each power sensor is a desired signal.

15. The radio frequency (RF) receiver of claim 1, wherein said output of said digital processing subsystem is sent to said control logic subsystem to serve as a power sensor for narrow band IF signals after said second IF filter (F4).

16. The radio frequency (RF) receiver of claim 1, wherein each of said power sensors has a threshold setting unique to its location in said system, said unique threshold setting for each said power sensor being set to a level just below a total RF power level where desired signal degradation occurs.

17. The radio frequency (RF) receiver of claim 1, wherein under conditions that said RF receiver is a considerable distance from interfering signal sources and none of said power sensor outputs exceeds their corresponding threshold settings, said bias controls of said A1, said M1, said A2, said LO1, said M2, said LO2, said A3 and said A4 are all set to low power such that said RF receiver operates with minimum power and generates minimum thermal load.

18. The radio frequency (RF) receiver of claim 1, wherein under conditions that said RF receiver has several large interfering signals present on its input, all of said interfering signals are approximately more than 100 MHz away from a tuned frequency of said receiver, said PowerSensor1 exceeds its threshold setting and none of said PowerSensor2 and said PowerSensor3 exceed their threshold settings, said bias output of said control logic subsystem fed to said RF amplifier (A1) is increased and all of the other said bias outputs of said control logic subsystem are set to low power as said interfering signals are blocked by said RF sub-band filter (F2).

19. The radio frequency (RF) receiver of claim 1, wherein under conditions that said RF receiver has a large interfering signal present on its input, said interfering signal is approximately 3 MHz away from a tuned frequency of said receiver, said outputs of said PowerSensor1, said PowerSensor2 and said PowerSensor3 exceed their threshold settings, thus said bias outputs of said control logic subsystem fed to said A1, said LO1, said M1, said A2, said LO2, said M2, and said A3 are increased and said bias output of said control logic subsystem fed to said A4 is set to low power such that said A1, said LO1, said M1, said A2, said LO2, said M2 and said A3 operate at high power and said A4 operates at low power as said interfering signal is blocked by said second IF narrow band filter (F4).

20. The radio frequency (RF) receiver of claim 1, wherein under conditions that said RF receiver has a moderately interfering signal present on its input, said interfering signal is approximately 20 MHz away from a tuned frequency of said RF receiver, said interfering signal is at a power level not exceeding a threshold setting of said PowerSensor1 but exceeding a threshold setting of said PowerSensor2 due to cascaded gain of said RF receiver, said interfering signal is filtered by said F3 and said F4, and said interfering signal is at a power level not exceeding threshold settings of said PowerSensor3 and said DSP, thus only said bias output of said control logic subsystem fed to said LO1, said M1 and said A2 is set to high power and said bias outputs of said logic control subsystem fed to said A1, said LO2, said M2, said A3, and said A4 are set to low power.

21. The radio frequency (RF) receiver of claim 1, further comprising a fourth power sensor (PowerSensor4) associated with said another secondary IF amplifier (A4) for coupling said narrow band IF signals associated with said another secondary IF amplifier (A4), the output of said PowerSensor4 being fed to said control logic subsystem.

22. A method for dynamic managing power consumption of a radio frequency (RF) receiver, comprising the steps of:
- a) receiving RF signals utilizing an antenna (ANT);
- b) filtering said RF signals from an output of said ANT to filtered full band RF signals utilizing an RF full band filter (F1);
- c) amplifying said filtered full band RF signals to enlarged full band RF signals suitable for RF sub-band filtering utilizing an RF amplifier (A1);
- d) filtering said enlarged full band RF signals to sub-band RF signals utilizing an RF sub-band filter (F2);
- e) providing a first local oscillator frequency through a first local oscillator (LO), denoted as LO1;
- f) translating a frequency of said sub-band RF signals from an output of said F2 to intermediate frequency (IF) signals utilizing an RF mixer (M1) operatively associated with said first local oscillator (LO1) and said first local oscillator frequency;
- g) amplifying said IF signals from an output of said M1 to enlarged IF signals suitable for IF wide band filtering utilizing a first IF amplifier (A2);
- h) filtering said enlarged IF signals from an output of said A2 to filtered wide band IF signals utilizing a first IF wide band filter (F3);
- i) providing a second local oscillator frequency through a second local oscillator (LO), denoted as LO2;
- j) translating a frequency of said filtered wide band IF signals from an output of said F3 to IF signals with a frequency lower than that of said output of said M1 utilizing an IF mixer (M2) operatively associated said second local oscillator (LO2) and said second local oscillator frequency;
- k) amplifying said IF signals from an output of said M2 to enlarged IF signals suitable for IF narrow band filtering utilizing a secondary IF amplifier (A3);
- l) filtering said enlarged IF signals of an output of said A3 to narrow band IF signals utilizing a second IF narrow band filter (F4);
- m) amplifying said narrow band IF signals of an output of said F4 to enlarged narrow band IF signals suitable for analog-to-digital conversion and digital signal processing utilizing another secondary IF amplifier (A4);
- n) converting said enlarged narrow band IF signals to digital signals and processing said digital signals utilizing a digital signal processing (DSP) subsystem, said digital signal processing subsystem comprising at least one analog-to-digital converter and at least one digital signal processor;
- o) coupling the full band RF signals associated with said RF amplifier (A1) utilizing a first power sensor (PowerSensor1) associated with said RF amplifier (A1);
- p) coupling the sub-band RF signals associated with said RF mixer (M1) utilizing a second power sensor (PowerSensor2) associated with said RF mixer (M1);
- q) coupling the wide band IF signals associated with said IF mixer (M2) utilizing a third power sensor (PowerSensor3) associated with said IF mixer (M2); and,
- r) detecting an interference environment and determining bias outputs of a control logic subsystem operatively associated with outputs of said power sensors and said digital signal processing subsystem, said bias outputs of said control logic subsystem being fed to said RF amplifier (A1), said first IF amplifier (A2), said secondary IF amplifiers (A3 and A4), and said local oscillators (LO1 and LO2) to control their power consumptions to reduce overall power consumption and thermal load of the RF receiver.

23. The method for dynamically managing power consumption of claim 22, wherein said step of detecting an interference environment and determining bias outputs of a control logic subsystem operatively associated with outputs of said power sensors and said digital signal processing subsystem (DSP), comprises the steps of:
- a) detecting a total signal power present due to interfering signals plus a desired signal present at said A1, said M1 and said M2, respectively;
- b) comparing said total signal power to a threshold setting unique to each of said power sensors, said unique threshold setting being set to a level just below a total RF power level where desired signal degradation occurs; and,
- c) setting said bias outputs of said control logic subsystem to low power to reduce power consumption if said interfering signals do not exceed said unique threshold settings of said power sensors.

24. The method for dynamically managing power consumption of claim 22, wherein said step of detecting an interference environment and determining bias outputs of a control logic subsystem operatively associated with outputs of said power sensors and said digital signal processing subsystem comprises the step of determining if a significant portion of a total power sensed at each power sensor is a desired signal utilizing said control logic subsystem based on said output of said DSP.

25. The method for dynamically managing power consumption of claim 22, wherein said step of controlling power consumption of said A1, said M1, said LO1, said A2, said M2, said LO2, said A3, and said A4 comprises the step of setting their programmable bias points utilizing said bias outputs of said control logic subsystem and providing IP3 performance proportional to DC power consumption.

26. The method for dynamically managing power consumption of claim 22, wherein under conditions that said RF receiver is a considerable distance from interfering signal sources, said step of detecting an interference environment and determining bias outputs of a control logic subsystem operatively associated with outputs of said power sensors and said digital signal processing subsystem, comprises the steps of:
- a) confirming none of said power sensor outputs exceed their corresponding threshold settings unique to each of said power sensors;
- b) setting all of said bias outputs of said control logic subsystem to low power; and,
- c) operating said A1, said M1, said LO1, said A2, said M2, said LO2, said A3, and said A4 with minimum power and generating minimum thermal load.

27. The method for dynamically managing power consumption of claim 22, wherein under conditions that said RF receiver has several large interfering signals present on its input, and all of said interfering signals are approximately more than 100 MHz away from a tuned frequency of said RF receiver, said step of detecting an interference environment and determining bias outputs of a control logic subsystem operatively associated with outputs of said power sensors and said digital signal processing subsystem, comprises the steps of:
- a) confirming said output of said PowerSensor1 associated with said RF amplifier (A1) exceeds its threshold setting;
- b) setting said bias of said A1 to high power utilizing bias output of said control logic subsystem;
- c) operating said A1 at high power;
- d) filtering said interfering signals utilizing RF sub-band filter (F2);

e) confirming none of said outputs of said PowerSensor2 and said PowerSensor3 exceed their threshold settings;

f) setting said bias of said M1, said LO1, said A2, said M2, said LO2, said A3, and said A4 to low power utilizing bias outputs of said control logic subsystem; and, g) operating said M1, said LO1, said A2, said M2, said LO2, said A3, and said A4 at low power.

28. The method for dynamically managing power consumption of claim 22, wherein under conditions that said RF receiver has a large interfering signal present on its input, and said interfering signal is approximately 3 MHz away from a tuned frequency of said RF receiver, said step of detecting an interference environment and determining bias outputs of a control logic subsystem operatively associated with outputs of said power sensors and said digital signal processing subsystem, comprises the steps of:

a) confirming said outputs of said PowerSensor1, said PowerSensor2 and said PowerSensor3 exceed their threshold settings, respectively;

b) setting said bias of said A1, said M1, said LO1, said A2, said M2, said LO2, said A3 to high power utilizing bias outputs of said control logic subsystem;

c) operating said A1, said M1, said LO1, said A2, said M2, said LO2, and said A3 at high power;

d) filtering said interfering signal utilizing said narrow band IF filter (F4);

e) setting said bias of said A4 to low power utilizing bias output of said control logic subsystem; and, f) operating said A4 at low power.

29. The method for dynamic managing power consumption claim 22, wherein under conditions that said RF receiver has a moderately high interfering signal present on its input, said interfering signal is approximately 20 MHz away from a tuned frequency of said RF receiver, and said interfering signal is at a power level not exceeding a threshold setting of said power sensor (PowerSensor1), said step of detecting an interference environment and determining bias outputs of a control logic subsystem operatively associated with outputs of said power sensors and said digital signal processing subsystem, comprises the steps of:

a) confirming said output of said PowerSensor1 does not exceed its threshold setting;

b) setting said bias of said A1 to low power utilizing bias output of said control logic subsystem;

c) operating said A1 at low power;

d) confirming said output of PowerSensor2 exceeds its threshold setting;

e) setting said bias of said M1, said LO1 and said A2 to high power utilizing bias output of said control logic subsystem;

f) operating said M1, said LO1 and said A2 at high power;

g) filtering said interfering signal utilizing said IF wide band filter (F3) and said IF narrow band filter (F4);

h) setting said bias of said M2, said LO2, said A3, and said A4 to low power utilizing bias output of said control logic subsystem; and, i) operating said M2, said LO2, said A3 and said A4 at low power.

* * * * *